(12) United States Patent
Maschhoff

(10) Patent No.: US 6,489,845 B1
(45) Date of Patent: Dec. 3, 2002

(54) MULTIPLEXING AMPLIFIER

(75) Inventor: Robert Henry Maschhoff, Cedar Crest, NM (US)

(73) Assignee: Goodrich Corporation, Charlotte, NC (US)

( * ) Notice: Subject to any disclaimer, the term of this patent is extended or adjusted under 35 U.S.C. 154(b) by 0 days.

(21) Appl. No.: 09/542,187

(22) Filed: Apr. 4, 2000

(51) Int. Cl.$^7$ .............. H03F 5/00; H03F 3/45; H03F 1/36

(52) U.S. Cl. .............. 330/147; 330/69; 330/252; 330/85; 330/86

(58) Field of Search .............. 330/69, 147, 252, 330/85, 86

(56) References Cited

U.S. PATENT DOCUMENTS

| | | |
|---|---|---|
| 3,638,131 A | 1/1972 | Sarkissian |
| 3,877,023 A | 4/1975 | Spicer et al. |
| 3,919,685 A * | 11/1975 | Haill .............. 330/51 |
| 4,184,125 A * | 1/1980 | Mullaly .............. 330/282 |
| 4,808,944 A | 2/1989 | Taylor |
| 5,180,932 A | 1/1993 | Bengel |
| 5,331,210 A * | 7/1994 | McCarroll .............. 307/351 |
| 5,352,987 A | 10/1994 | Harvey |
| 6,040,732 A * | 3/2000 | Brokaw .............. 327/408 |
| 6,218,887 B1 * | 4/2001 | Brown .............. 327/408 |

FOREIGN PATENT DOCUMENTS

JP 4170814 6/1992

OTHER PUBLICATIONS

Article "Up Close And Personal With High–Speed Crosspoint Switches", by S. Pavlik and P. Checkovich; Electronic Design, Oct. 12, 1998; pp. 40–48.

* cited by examiner

*Primary Examiner*—Patricia Nguyen
(74) *Attorney, Agent, or Firm*—Renner, Otto, Boisselle & Sklar (57) ABSTRACT

A multiplexing amplifier has a differential amplifier for amplifying multiple input signals which are selected by a plurality input select circuits. The select circuits are comprised of longtail transistor pairs which are activated by current steering diodes controlled by input selection signals.

28 Claims, 9 Drawing Sheets

MULTIPLEXING AMPLIFIER

TECHNICAL FIELD

The present invention relates to amplifiers, and more particularly a multiple input amplifier having an input selection feature.

BACKGROUND OF THE INVENTION

It is sometimes necessary in the electronic circuitry art to have a multiplicity of inputs for obtaining a singular output, wherein the input to be selected is determined by selection signals.

Amplifiers are typically known in the electronic circuits art to be devices with a single input and a single output, wherein the input is amplified by an amplification factor and provided at the output.

In order to selectively amplify a multiplicity of input signals, either a multiplicity of amplifiers for each input signal is required or the input signals need to be selected utilizing a multiplexor prior to amplification by a singular amplifier. Typically in the prior art, the second approach is utilized and a multiplexor and amplifier are connected in stages. The multiplexor receives a plurality of input signals and a plurality of select control signals. The multiplexor provides unitary gain to the input signals and selects which input signal is to be amplified based on the select signals. The output of the multiplexor is therefore connected to the input of the amplifier. A multiplicity of signals are thus selectively amplified in this manner.

Typically, multiplexors in the prior art have been either relatively slow acting devices or semiconductor devices with a low degree of isolation between inputs, so that abnormal excursions of one input line typically effects other input lines. Another disadvantage to using multiplexors in combination with amplifiers is the fact that the two functions typically require different semiconductor processes and are thus difficult to integrate (i.e. multiplexors require CMOS technology and amplifiers are best utilizing bipolar technology).

Efforts to improve such systems have lead to continuing developments to improve their versatility, efficiency, practicality, speed and costs.

DISCLOSURE OF THE INVENTION

An object of the present invention is to provide an amplifier circuit that provides a multiplicity of input terminals configured such that a single output is generated.

Another object of the present invention is to provide an amplifier circuit that provides a multiplicity of input terminals configured such that when one or more of the input signals is activated the result is an output signal proportional to the input.

Another object of the present invention is to provide an amplifier circuit that provides a multiplicity of input terminals such that when more than one input is activated the output represents the sum of the activated inputs.

According to the present invention, a multiplexing amplifier circuit which receives a plurality of input signals selected by a plurality of select control signals includes a differential amplifier which provides an output signal indicative of the input signal across a positive input and a negative input;

a selection circuit corresponding to each input signal having a longtail pair of first and second transistors wherein the first transistor receives the input signal and drives the negative input of the differential amplifier and the second transistor receives the feed back output signal and drives the positive input of the differential amplifier;

a pair of diodes connected to each transistor for steering the current through the transistor;

wherein each select signal biases the corresponding diodes to thereby cause its corresponding longtail transistor pair to provide the corresponding input signal across the differential amplifier inputs.

The present invention provides for a multiplexing amplifier circuit having a high degree of isolation of inputs from each other such that only the activated input contributes to the output. In other words there is a low level of cross talk between the inputs.

The present invention also provides the ability to block very high abnormal voltages on inactivated inputs thereby keeping them from contaminating the output.

The present invention can be implemented in a number of semiconductor technologies, including bipolar and junction FET.

The present invention lends itself particularly well to monolithic integration with bipolar semiconductor technology, thereby providing a very low cost, very small composite device.

The present invention provides a selector or multiplexor with very high speed.

The present invention can be implemented making use of existing operational amplifier technology thereby reducing the risk of monolithic integration development.

The present invention is well suited for automated assembly utilizing surface mount components when implementation using discrete components is elected.

The present invention also provides the ability to accommodate completely floating inputs (isolated from circuit ground).

To the accomplishment of the foregoing in related as, the invention, then, comprises the features hereinafter fully described and particularly pointed out in the claims. The following description and the annex drawing set forth in detail certain illustrated embodiments of the invention. These embodiments are indicative, however, of but a few of the various ways in which the principals of the invention may be employed. Other objects, advantages, and new features of the invention will become apparent from the following detailed description of the invention when considered in conjunction with the drawings.

BEST MODE FOR CARRYING OUT THE INVENTION

Figure 1A:
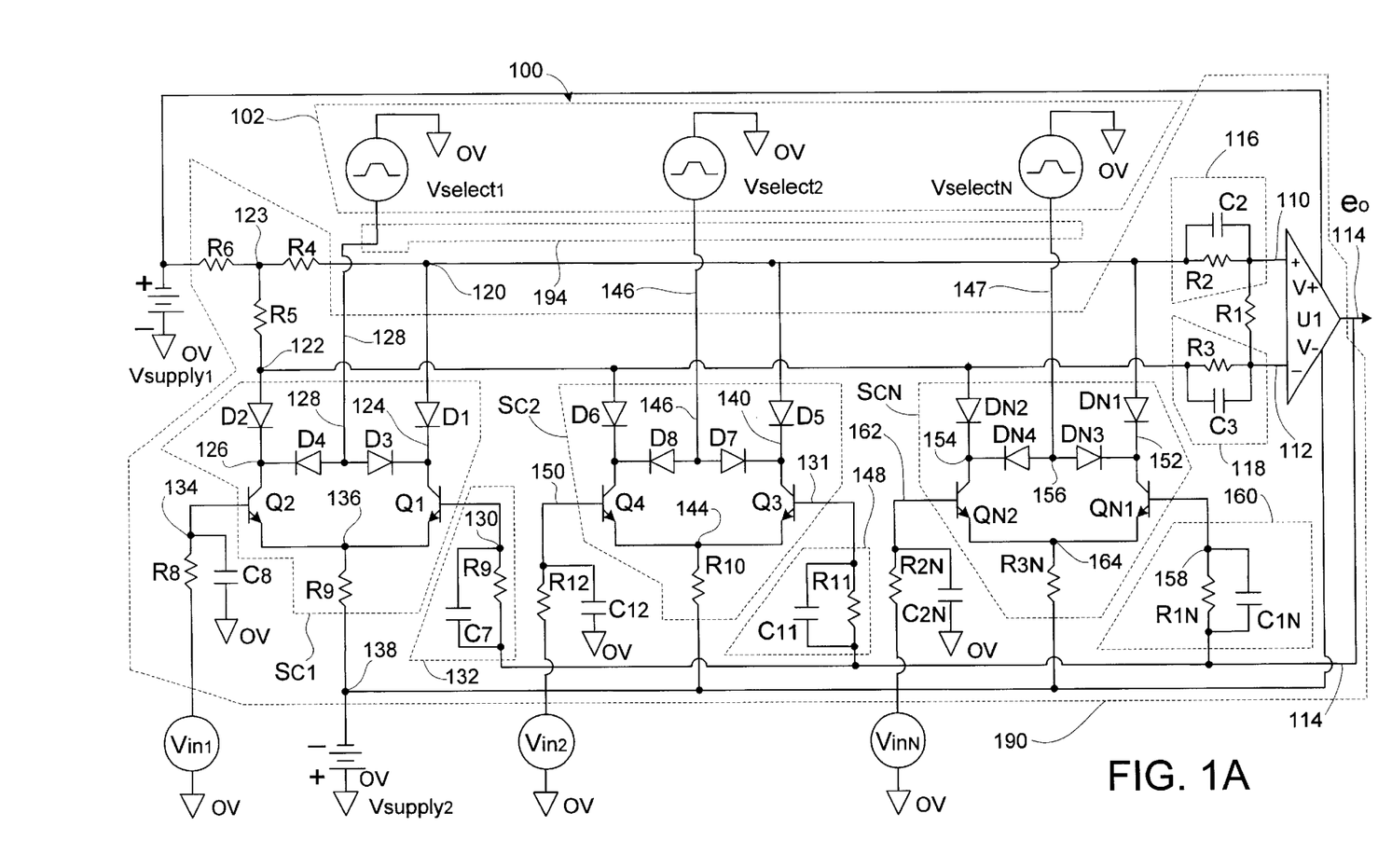
FIG. 1A is a schematic drawing of an amplifier circuit in accordance with the present invention.

Referring now to FIG. 1A, wherein an amplifier circuit 100 in accordance with the present invention includes a high gain voltage, or operational amplifier U1 having two inputs lines 110, 112. The and therefore amplifying the voltage difference between the positive (or plus) input line 110 and the negative (or minus) input line 112. The output $e_o$ is provided on a line 114. A resistor R1 is connected between input lines 110, 112. Input line 110 is also connected to a stabilizing network or compensation network 116 comprising a resistor R2 and a capacitor C2. Input line 112 is connected to a stabilizing network or compensation network 118 comprising a resistor R3 and a capacitor C3. The signal appearing at the inputs of U1 are determined by a plurality of input selection circuits SC1, SC2, SCN, where SCN represents one or more similar circuits, the number of selection circuits being variable depending on the particular application. All selection circuits are connected to a pair of common nodes 120, 122 which provide the input signal through networks 116, 118 to input lines 110, 112, respectively. Node 120 is also connected to a resistor R4. Node 122 is also connected to a resistor R5. The other end of resistors R4, R5 are connected to a node 123. A resistor R6 is connected between node 123 and a positive voltage supply $V_{SUPPLY1}$.

With respect to selection circuit SC1, the anode of a diode D1 is connected to node 120. The anode of a diode D2 is connected to node 122. The cathode of diode D1 is connected to a node 124, which also connects the cathode of a diode D3 and the collector of a transistor Q1. The cathode of diode D2 is connected to a node 126 which also connects the cathode of a diode D4 and the collector of a transistor Q2. A node 128 connects the anodes of diodes D3, D4 to an input select driver voltage source $V_{SELECT1}$. The base of transistor Q1 is connected to a node 130. A network 132 having a resistor R7 and capacitor C7 is connected between node 130 and the output line 114. The base of transistor Q2 is connected to a node 134. A resistor R8 is connected between node 134 and an input source signal $V_{IN1}$. A capacitor C8 is connected between node 134 and ground.

A resistor R9 is connected between a node 136 which connects the emitters of transistors Q1, Q2 and a negative voltage supply $V_{SUPPLY2}$ (i.e. the tail of the transistor pair).

With respect to selection circuit SC2, the anode of a diode D5 is connected to node 120. The anode of a diode D6 is connected to node 122. The cathode of diode D5 is connected to a node 140, which also connects the cathode of a diode D7 and the collector of a transistor Q3. The cathode of diode D6 is connected to a node 142 which also connects the cathode of a diode D8 and the collector of a transistor Q4. A node 146 connects the anodes of diodes D7, D8 to an input select driver voltage source $V_{SELECT2}$. The base of transistor Q3 is connected to a node 131. A network 148 having a resistor R11 and capacitor C11 is connected between node 131 and the output line 114. The base of transistor Q4 is connected to a node 150. A resistor R12 is connected between node 150 and an input source signal $V_{IN2}$. A capacitor C12 is connected between node 150 and ground. A resistor R10 is connected between a node 144 which connects the emitters of transistors Q3, Q4 and negative voltage supply $V_{SUPPLY2}$.

It can be seen that selection circuit SCN is similar to selection circuits SC1 and SC2. It is intended that selection circuits not specifically illustrated herein may be added to the present amplifier circuit in a manner similar to SC1, SC2, and SCN. With regard to selection circuit SCN, the anode of a diode DN1 is connected to node 120. The anode of a diode DN2 is connected to node 122. The cathode of diode DN1 is connected to a node 152, which also connects the cathode of a diode DN3 and the collector of a transistor QN1. The cathode of diode DN2 is connected to a node 154 which also connects the cathode of a diode DN4 and the collector of a transistor QN2. A node 156 connects the anodes of diodes DN3, DN4 to an input select driver voltage source $V_{SELECTN}$. The base of transistor QN1 is connected to a node 158. A network 160 having a resistor R1N and capacitor C1N is connected between node 160 and the output line 114. The base of transistor QN2 is connected to a node 162. A resistor R2N is connected between node 162 and an input source signal $V_{INN}$. A capacitor C2N is connected between node 162 and ground. A resistor R3N is connected between a node 164 which connects the emitters of transistors QN1, QN2 and negative voltage supply $V_{SUPPLY2}$.

Transistors pairs Q1 and Q2, Q3 and Q4, QN1 and QN2 represent longtail transistor pairs because they each share a common resistor R9, R10, R3N, respectively.

Operation of circuit 100 is as follows. Circuit 100 represents a three or more selection input amplifier. The input selection is determined by the state of the signal provided by the input select drivers $V_{SELECT1}$, $V_{SELECT2}$ and $V_{SELECTN}$. Currents indicative of (or a function of) the input voltages $V_{IN1}$, $V_{IN2}$ and $V_{INN}$ will flow in transistor pairs Q1 and Q2, Q3 and Q4, QN1 and QN2 as long as the input voltages are more positive than the negative supply $V_{SUPPLY2}$ by at least one base to emitter voltage drop $V_{BE}$ (i.e. $\not\subset$ 0.6 V). The states of control signals $V_{SELECT1}$, $V_{SELECT2}$, $V_{SELECTN}$ control whether these currents flow through R4 and R5 or not. When these select control voltages are equal to or higher than the positive supply voltage $V_{SUPPLY1}$ then the longtail Q1 and Q2, Q3 and Q4, QN1 and QN2 pair currents are diverted from R4 and R5. No input ($V_{IN1}$, $V_{IN2}$, or $V_{INN}$) is selected under this condition because the diodes D1, D2, D5, D6, DN1, DN2 for the respective selection circuit are back biased.

Input $V_{IN1}$ is selected by setting the $V_{SELECT1}$ voltage to a low level or zero. Diodes D1 and D2 are now forward biased and diodes D3 and D4 now become back biased and the Q1, Q2 pair current will flow through R4 and R5. The current through R4 and R5 will be driven to equality by virtue of the high gain of amplifier U1 driving the feedback point 130 at the base of Q1 to equality with the base of Q2 (a near zero voltage difference as occasioned by the high gain of the loop).

Input $V_{IN2}$ is selected by returning $V_{SELECT1}$ to a high level and setting $V_{SELECT2}$ to a low level of zero, which back biases diodes D7 and D8 and forward biases diodes D5 and D6.

Networks 116, 118, 132, 148 and 160 serve to stabilize the closed loop system resulting from the feedback arrangement.

The diodes in the select control circuits are considered current steering diodes because they in effect steer the current through the longtail pairs of transistors. The turn on time of the signal is dependent therefore only on the response time of the current steering diodes and the transistors.

Advantages of circuit 100 is that each input signal is immune to what is happening on the other input signal lines, (also described as a high degree of isolation between the inputs). It can also be seen that an abnormal voltage on either input line does not damage the rest of the circuit or cause it to go into a state where timely recovery of the output does not occur when that input is deactivated.

Figure 1B:
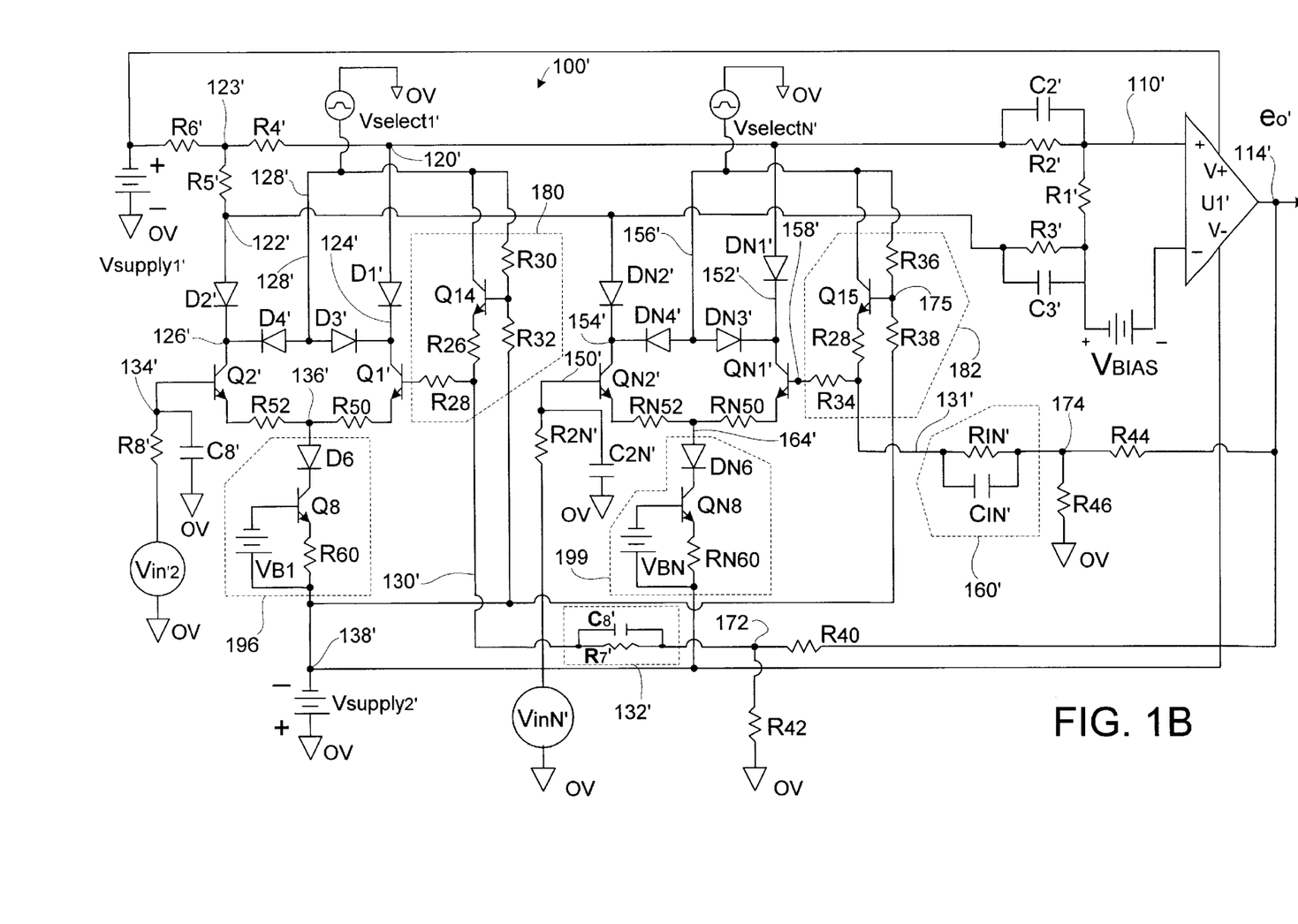
FIG. 1B is a schematic drawing of an amplifier circuit in accordance with another embodiment of the present invention.

Referring now to FIG. 1B, wherein an amplifier circuit in accordance with an additional embodiment of the present invention is generally similar to the amplifier circuit illustrated hereinbefore in FIG. 1A and is thus indicated by reference numerals corresponding to those discussed above, except that a prime (') mark on each corresponding part number is utilized. A circuit 100' includes a high gain voltage, or operational amplifier U1' having two inputs lines 110', 112'. The operational amplifier is being utilized as a differential amplifier and therefore amplifying the voltage difference between the positive input line 110' and the negative input line 112'. The output $e_o'$ is provided on a line 114'. A resistor R1' is connected between input lines 110', 112'. Input line 110' is also connected to a filter comprising a resistor R2' and a capacitor C2'. Input line 112' is connected to a negative bias voltage source $V_{BIAS}$. A filter comprising a resistor R3' and a capacitor C3' is connected to the positive side of $V_{BIAS}$. The signal appearing at the inputs of U1' are determined by a plurality of input selection circuits, each selection circuit being utilized for selecting a respective input signal from a plurality of respective input signal sources $V_{IN1}'$, $V_{INN}'$, the number of selection circuits being variable depending on the particular application. All selection circuits are connected to a pair of common nodes 120', 122' which provide the input signal through the filters to input lines 110', 112', respectively. Node 120' is also connected to a resistor R4'. Node 122' is also connected to a resistor R5'. The other end of resistors R4', R5' are connected to a node 123'. A resistor R6' is connected between node 123' and a positive voltage supply $V_{SUPPLY1}'$.

With respect to selection circuit for $V_{IN1}'$, the anode of a diode D1' is connected to node 120'. The anode of a diode D2' is connected to node 122'. The cathode of diode D1' is connected to a node 124', which also connects the cathode of a diode D3' and the collector of a transistor Q1'. The cathode of diode D2' is connected to a node 126' which also connects the cathode of a diode D4 and the collector of a transistor Q2'. A node 128' connects the anodes of diodes D3', D4' to an input select driver voltage source $V_{SELECT1}'$. The base of transistor Q1' is connected to a resistor R28. The other end of resistor 28 is connected to a node 130'. A filter 132' having a resistor R7' and capacitor C7' is connected between node 130' and a node 172. A resistor R40 is connected between node 172 and the output line 114'. A resistor R42 is connected between node 172 and ground.

The collector of a transistor Q14 is also connected to node 128'. The base of Q14 is connected to a node 173. A resistor R30 is connected between node 173 and node 128'. A resistor R32 is connected between node 173 and node 138'. The emitter of Q14 is connected to a resistor R26. The other end of R26 is connected to node 130'. Q14, R26, R28, R30 and R32 comprise a driving circuit 180.

The base of transistor Q2' is connected to a node 134'. A resistor R8' is connected between node 134' and an input source signal $V_{IN1}'$. A capacitor C8' is connected between node 134' and ground.

A constant current source circuit 196 is connected to node 136' and has a diode D6, the anode of which is connected to node 136'. The cathode of D6 is connected to the collector of a transistor Q8. The emitter of Q8 is connected to a resistor R60.

The other end of resistor R60 is connected to negative voltage supply $V_{SUPPLY2}'$. A bias voltage source $V_{B1}$ is connected between the base of Q8 and $V_{SUPPLY2}'$.

With regard to the selection circuit for $V_{INN}'$, the anode of a diode DN1' is connected to node 120'. The anode of a diode DN2' is connected to node 122'. The cathode of diode DN1' is connected to a node 152', which also connects the cathode of a diode DN3' and the collector of a transistor QN1'. The cathode of diode DN2' is connected to a node 154' which also connects the cathode of a diode DN4' and the collector of a transistor QN2'. A node 156' connects the anodes of diodes DN3', DN4' to an input select driver voltage source $V_{SELECTN}'$. The base of transistor QN1' is connected to a node 158'. A filter 160' having a resistor R1N' and capacitor C1N' is connected between node 131' and node 174. The base of transistor QN2' is connected to a node 150'. A resistor R2N' is connected between node 150' and an input source signal $V_{INN}'$. A capacitor C2N' is connected between node 150' and ground. A resistor RN50 is connected between the emitter of transistor QN1' and a node 164'. A resistor RN52 is connected between the emitter of transistor QN2' and node 164'. The base of transistor QN1' is connected to a resistor R34. The other end of resistor R34 is connected to a node 131'. A resistor R44 is connected between node 174 and the output line 114'. A resistor R46 is connected between node 174 and ground.

A constant current source circuit 199 is connected to node 164' and has a diode DN6, the anode of which is connected to node 164'. The cathode of DN6 is connected to the collector of a transistor QN8. The emitter of QN8 is connected to a resistor RN60. The other end of resistor RN60 is connected to negative voltage supply $V_{SUPPLY2}'$. A bias voltage source $V_{BN}$ is connected between the base of QN8 and $V_{SUPPLY2}'$.

The collector of a transistor Q15 is also connected to node 156'. The base of Q1S is connected to a node 175. A resistor R36 is connected between node 175 and node 156'. A resistor R38 is connected between node 175 and node 138'. The emitter of Q15 is connected to a resistor R35. The other end of R35 is connected to node 131'. Q15, R34, R35, R36 and R38 comprise a driving circuit 182.

Transistors pairs Q1' and Q2', QN1' and QN2' represent longtail transistor pairs because the emitters are connected to a common node through resistors R50 and R52, RN50 and RN52, respectively.

Operation of circuit 100' is as follows. Circuit 100' represents a two or more selection input amplifier. The input selection is determined by the state of the signal provided by the input select drivers $V_{SELECT1}'$ and $V_{SELECTN}'$. The input of U1' is a function of the current flowing through R4' and R5', which is a function of the current flowing through the transistors Q1', Q2', QN1', QN2', of the selection circuits.

Constant current source circuit 196 ensures that a constant current is flowing through the combination of Q1' and Q2' and therefore R4' and R5'. The ratio of current flowing through Q1' and Q2' is directly proportional to the signal provided by signal source $V_{IN1}'$.

Constant current source circuit 199 ensures that a constant current is flowing through the combination of QN1' and QN2' and therefore R4' and R5'. The ratio of current flowing through QN1' and QN2' is directly proportional to the signal provided by signal source $V_{INN}'$.

Input $V_{IN1}'$ is selected by setting the $V_{SELECT1}'$ voltage to a low level or zero. Diodes D1' and D2' are now forward biased and diodes D3' and D4' now become back biased and the Q2' current will flow through R5'. The output of U1' will be proportional to the current through R5'. The current through R4' and R5' will be driven to equality by virtue of the high gain of amplifier U1' driving the feedback point 130' at the base of Q1' to equality with the base of Q2' (a zero voltage difference).

Driving circuit 180 serves to ensure that the feedback voltage at the base of Q1' is greater (more positive) than the input voltage on line 120' when Q1' and Q2' are not selected. The current drawn from the source $V_{IN1}'$ when Q1' and Q2' are not selected is then extremely small or zero. Driving circuit 182 serves to insure that the feedback voltage at the base of QN1' is greater (more positive) than the input voltage on line 120' when QN1' and QN2' are not selected. The current drawn from the source VINN' when QN1' and QN2' are not selected is then extremely small or zero. By keeping the duty cycle low for any input channel, the disturbance to the source due to current flow is minimized. The filtering action of R8' and C8' serve to smooth the residual disturbance.

Input $V_{INN}'$ is selected by setting the $V_{SELECTN}'$ voltage to a low level or zero. Diodes DN1' and DN2' are now forward biased and diodes DN3' and DN4' now become back biased and the QN2' current will flow through R5'. The output of U1' will be proportional to the current through R5'. The current through R4' and R5' will be driven to equality by virtue of the high gain of amplifier U1' driving the feedback point 131' at the base of QN1' to equality with the base of QN2' (a zero voltage difference).

Driving circuit 182 serves to insure that the feedback voltage at the base of QN1' is greater (more positive) than the input voltage on line 120' when QN1' and QN2' are not selected. The current drawn from the source $V_{INN}'$ when QN1' and QN2' are not selected is then extremely small or zero. By keeping the duty cycle low for any input channel, the disturbance to the source due to current flow is minimized. The filtering action of R2N' and C2N' serve to smooth the residual disturbance.

The filter networks in circuit 100' serve to stabilize the closed loop system resulting from the feedback arrangement.

The diodes in the select control circuits are considered current steering diodes because they in effect steer the current through the longtail pairs of transistors.

It is also to be noted that over voltage inputs on the input lines do not effect the channels that are operating in the normal voltage ranges.

The bias voltage $V_{BIAS}'$ connected between R1' and input line 112' insures that an input line is not selected until the input signal reaches a predetermined level, which is greater than the bias.

When $V_{IN1}'$ is selected, the gain A of the amplifier circuit is described by the following equation.

$$A = (R40 + R42)/R42$$

When $V_{INN}'$ is selected, the gain A of the amplifier circuit is described by the following equation.

$$A = (R44 + R46)/R46$$

It is to be noted that there are three distinctions between the circuit of FIG. 1B and FIG. 1A. First, in FIG. 1A all inputs operate with the same gain whereas in FIG. 1B each channel can be provided a unique gain as determined by the divider resistors R44, R46, R40, R42. Secondly, the signal source currents in FIG. 1B are very low or zero when not selected. Thirdly, the tails of the respective longtail transistor pairs use a constant current source rather than a resistor.

Figure 1C:
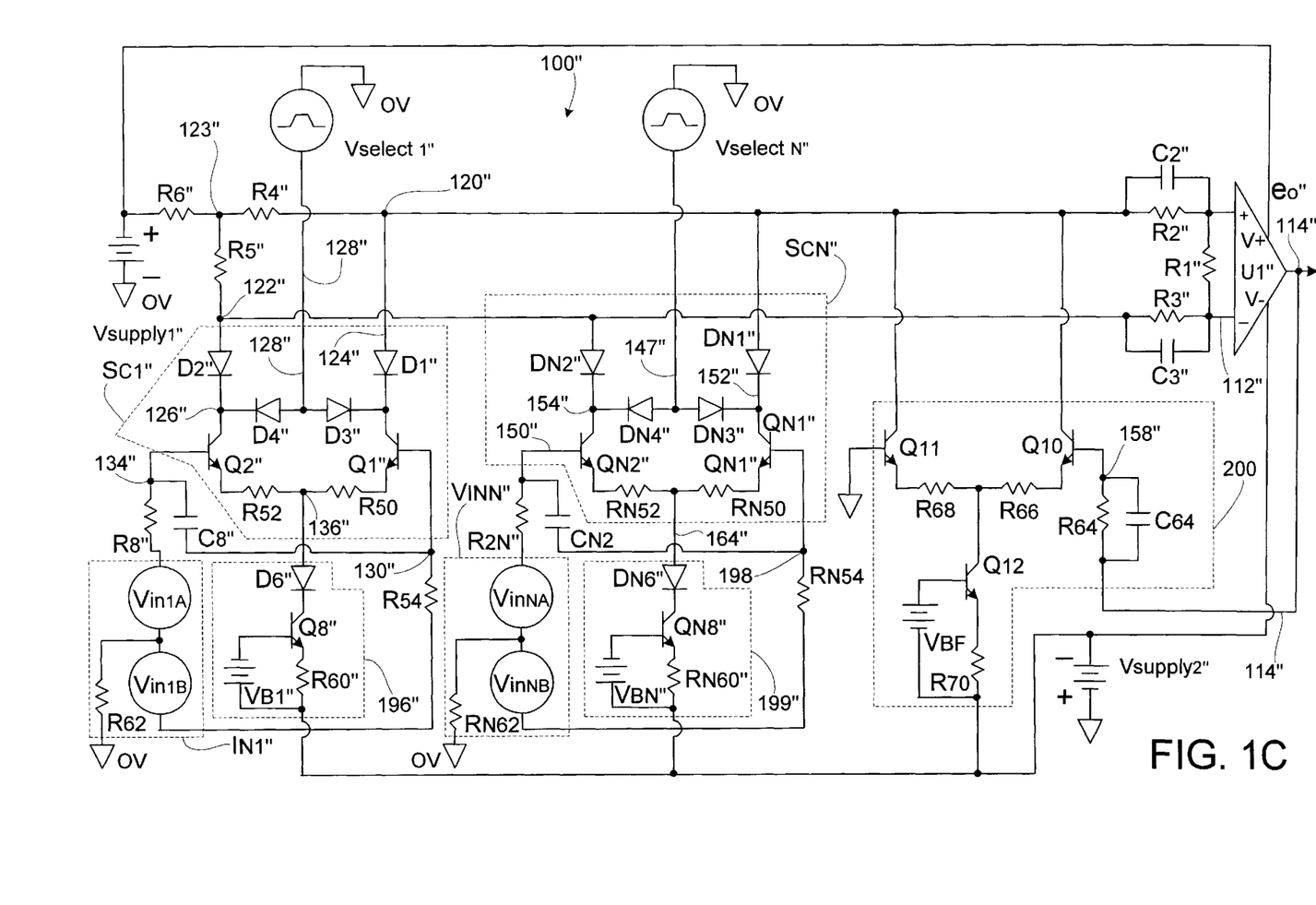
FIG. 1C is a schematic drawing of an amplifier circuit in accordance with another embodiment of the present invention.

Referring now to FIG. 1C, wherein an amplifier circuit in accordance with an additional embodiment of the present invention is generally similar to the amplifier circuit illustrated hereinbefore in FIG. 1A and is thus indicated by reference numerals corresponding to those discussed above, except that a double prime (") mark on each corresponding part number is utilized. A circuit 100" includes a high gain voltage, or operational amplifier U1" having two inputs lines 110", 112". The operational amplifier is being utilized as a differential amplifier and therefore amplifying the voltage difference between the positive input line 110" and the negative input line 112". The output $e_o$" is provided on a line 114". A resistor R1" is connected between input lines 110", 112". Input line 110" is also connected to a filter comprising a resistor R2" and a capacitor C2". Input line 112" is connected to a filter comprising a resistor R3" and a capacitor C3". The signal appearing at the inputs of U1" is determined by a plurality of input selection circuits, each selection circuit being utilized for selecting a respective input signal from a plurality of respective input signal sources $V_{IN1}"$, $V_{INN}"$, the number of selection circuits being variable depending on the particular application. The input signal sources $V_{IN1}"$, $V_{INN}"$ are differential sources (and illustrated as being comprised of a pair of signal drivers $V_{IN1A}$ and $V_{IN1B}$, $V_{INNA}$ and $V_{INNB}$ with a common node between each driver pair being connected to ground through a resistor R62, RN62). All selection circuits are connected to a pair of common nodes 120", 122" which provide the input signal through the filters to input lines 110", 112", respectively. Node 120" is also connected to a resistor R4". Node 122" is also connected to a resistor R5". The other ends of resistors R4", R5" are connected to a node 123". A resistor R6" is connected between node 123" and a positive voltage supply $V_{SUPPLY1}"$.

With respect to selection circuit controlled by $V_{SELECT1}"$ the anode of a diode D1" is connected to node 120". The anode of a diode D2" is connected to node 122". The cathode of diode D1" is connected to a node 124", which also connects the cathode of a diode D3" and the collector of a transistor Q1". The cathode of diode D2" is connected to a node 126" which also connects the cathode of a diode D4" and the collector of a transistor Q2". A node 128" connects the anodes of diodes D3", D4" to an input select driver voltage source $V_{SELECT1}"$. The base of transistor Q1" is connected to a node 130". A resistor R54 is connected between node 130" and input signal driver $V_{IN1B}$.

The base of transistor Q2" is connected to a node 134". A resistor R8" is connected between node 134" and input signal driver $V_{IN1}"$. A capacitor C8" is connected between node 134" and node 130".

A constant current source circuit 196 is connected to node 136" and has a diode D6", the anode of which is connected to node 136". The cathode of D6" is connected to the collector of a transistor Q8". The emitter of Q8" is connected to a resistor R60". The other end of resistor R60" is connected to negative voltage supply $V_{SUPPLY2}"$. A bias voltage source $V_{B1}"$ is connected between the base of Q8" and $V_{SUPPLY2}"$.

With regard to the selection circuit for select signal $V_{SELECTN}"$, the anode of a diode DN1" is connected to node 120" The anode of a diode DN2" is connected to node 122". The cathode of diode DN1" is connected to a node 152", which also connects the cathode of a diode DN3" and the collector of a transistor QN1". The cathode of diode DN2" is connected to a node 154" which also connects the cathode of a diode DN4" and the collector of a transistor QN2". A node 147" connects the anodes of diodes DN3", DN4" to an input select driver voltage source $V_{SELECTN}$". The base of transistor QN1" is connected to a node 198. The base of transistor QN2" is connected to a node 150'. A resistor R2N" is connected between node 150" and input signal source $V_{INN}$".

The emitter of transistor QN1" is connected to a resistor RN50. The emitter of transistor QN2" is connected to a resistor RN52. Resistors RN50, RN52 are connected to a node 164".

A feedback circuit 200 includes a transistor Q10 having its collector connected to node 122", its base connected to a node 158", and its emitter connected to a resistor R66. A filter having a resistor R64 and a capacitor C64 connects node 158" to output line 114". A transistor Q11 has its collector connected to node 120", its base connected to ground, and its emitter connected to a resistor R68. A node 202 connects resistors R66 and R68 to the collector of a transistor Q12. The emitter of Q12 is connected to the negative supply voltage $V_{SUPPLY2}$ through a resistor R70. A bias voltage supply $V_{BF}$ is connected between the base of Q12 and $V_{SUPPLY2}$.

Operation of circuit 100" is as follows. Circuit 100" represents a two or more selection input amplifier. The input selection is determined by the state of the signal provided by the input select drivers $V_{SELECT1}$" and $V_{SELECTN}$". The input of U1" is a function of the current flowing through R4" and R5", which is a function of the current flowing through the transistors Q1", Q2", QN1", QN2" of the selection circuits.

Constant current source circuit 196" ensures that a constant current is flowing through the combination of Q1" and Q2" and therefore R4" and R5" when selected. The ratio of current flowing through Q1" and Q2" is directly proportional to the voltage difference provided by differential voltage source $V_{IN1}$" across the bases of Q1" and Q2".

Constant current source circuit 199" ensures that a constant current is flowing through the combination of QN1" and QN2" and therefore R4" and R5" when selected. The ratio of current flowing through QN1" and QN2" is directly proportional to the voltage difference provided by differential voltage source $V_{INN}$" across the bases of QN1" and QN2".

Feedback circuit 200 drives the current through R4" and R5" to be equal.

When $V_{SELECT1}$" AND $V_{SELECTN}$" are selected simultaneously, the current through R4' and R5" will be the sum of the currents flowing through the circuits SC1" and SCN". In this manner, the embodiment of FIG. 1C is a summing multiple input selection amplifier.

The operational amplifier utilized for the present invention may be any of a number of high gain voltage amplifiers with high input impedance which are utilized in such a way that the properties of the circuits are controlled predominantly by the circuit parameters rather than the characteristics of the operational amplifier. The preferred operational amplifier for U1 and U1" is Part Number LF411 available from any of a number of sources well known to those skilled in the art, such as National Semiconductor. Another exemplary alternative is Part Number AD712 available from Analog Devices.

Figure 2:
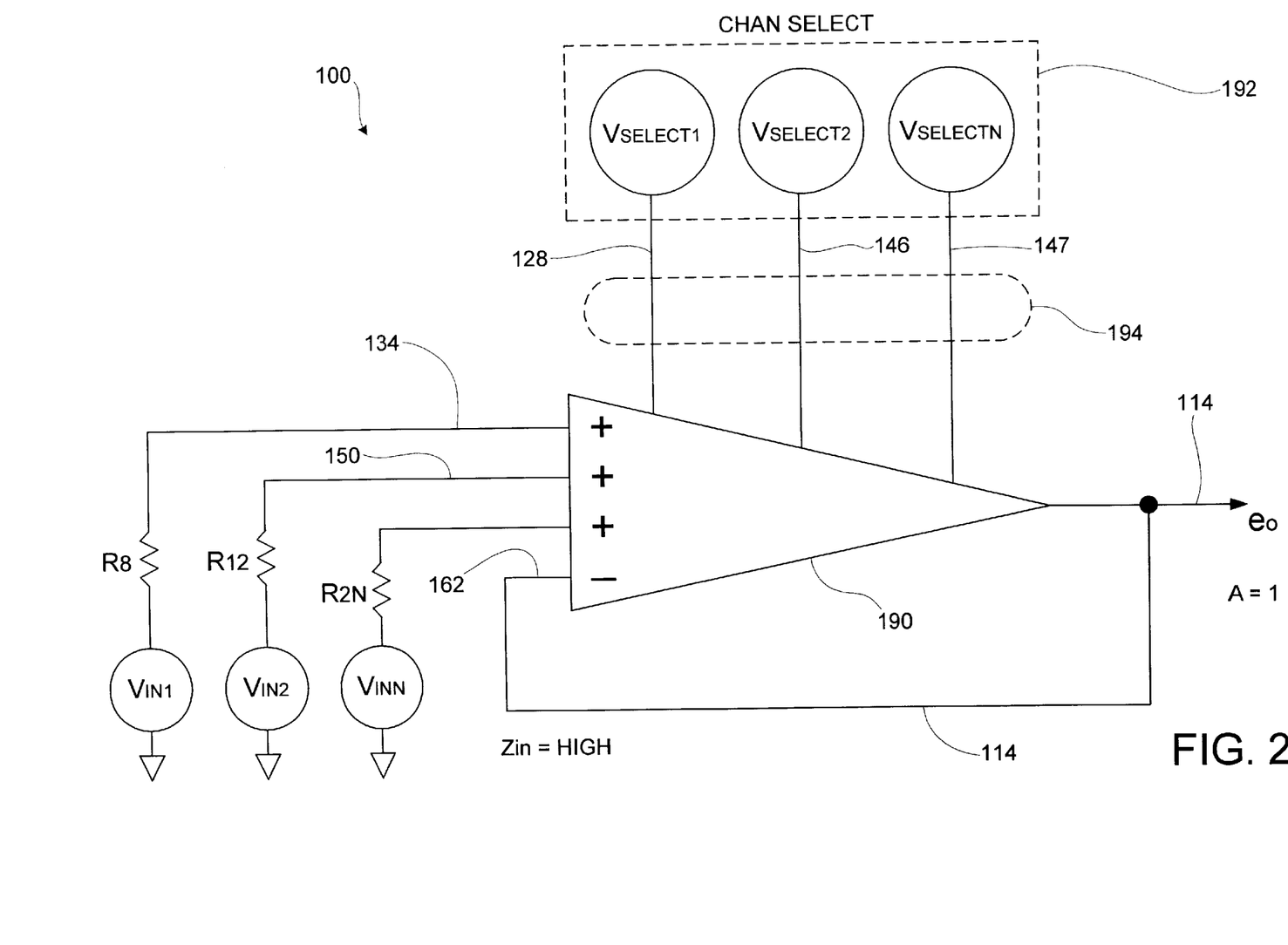
FIG. 2 is a simplified schematic drawing of the amplifier circuit of FIG. 1A.

Referring now to FIG. 2 wherein a simplified schematic diagram of the multiple input amplifier circuit 100 described hereinbefore in FIG. 1A is shown. Where appropriate, reference numerals that designate elements common to FIG. 1A will be carried over. In the simplified schematic, an amplifier 190 has multiple input lines 134, 150, 162. The output $e_o$ of 190 is provided on a feedback line 114. One of the input signal sources $V_{IN1}$, $V_{IN2}$, $V_{INN}$ is selected as described hereinbefore by channel select circuits SC1, SC2, SCN utilizing channel select signals $V_{SELECT1}$, $V_{SELECT2}$, $V_{SELECTN}$. The channel select signal sources are collectively represented in FIG. 2 by a box 192. The channel select controller 192 has output lines corresponding to lines 128, 146, 147 in FIG. 1A and collectively represented in FIG. 2 by a line 194. Source resistors R8, R12, R2N are connected between the input signal sources and the amplifier circuit 190. It can be seen that the amplifier circuit 100 represents a non-inverting, unity gain, amplifier connection scheme. The common feedback signal provided on line 114 is be applied to the feedback side of each longtail transistor pair illustrated in FIG. 1. As each transistor pair is enabled in some arbitrary sequence the voltage difference across the selected pair is driven to zero. Principal application of the circuit of FIGS. 1A and 2 is replacement of a single ended, high level multiplexor.

Figure 3:
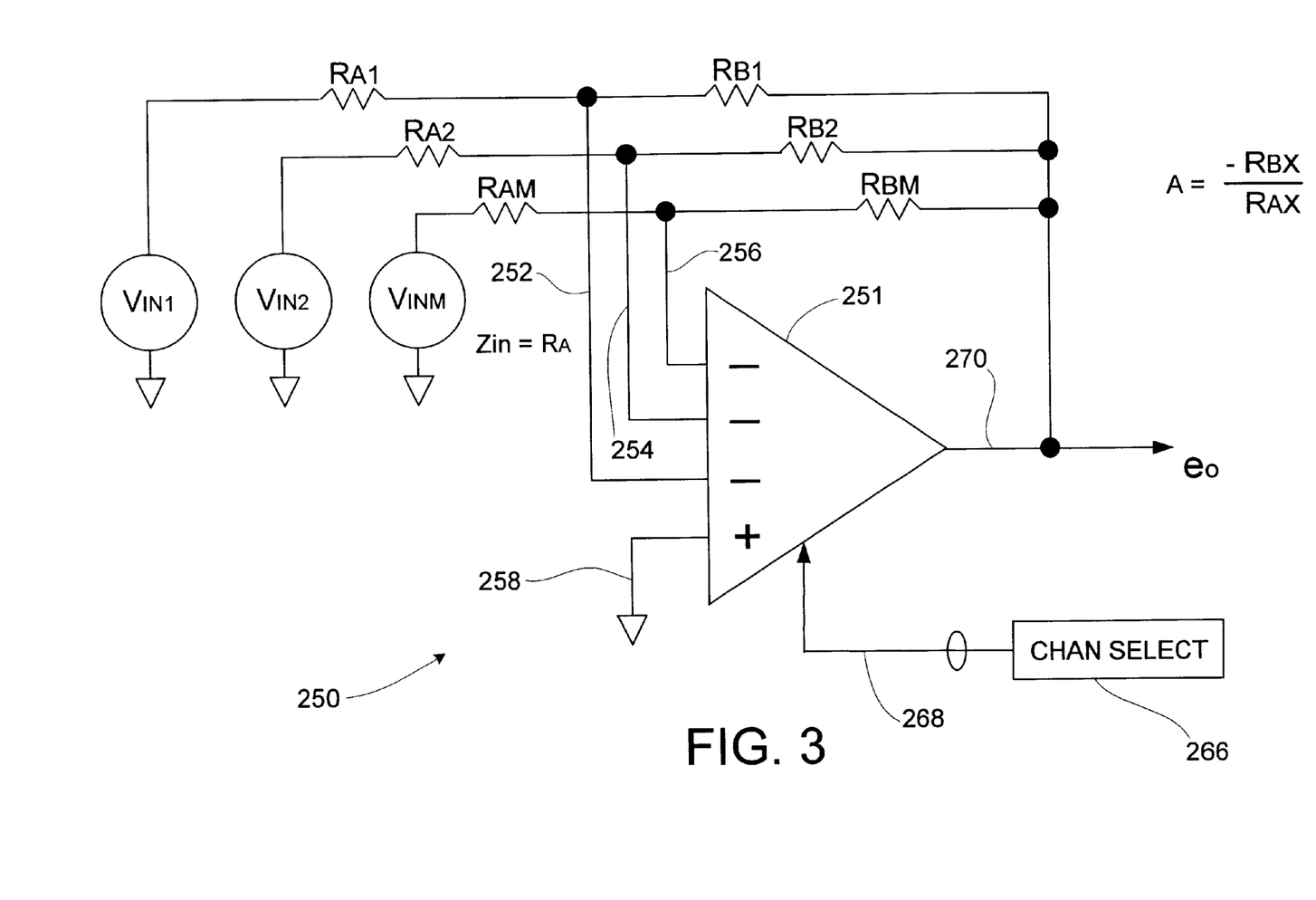
FIG. 3 is a simplified schematic drawing of an alternative application of an amplifier circuit in accordance with the present invention.

Referring now to FIG. 3, wherein a simplified schematic diagram of an alternative embodiment of a multiple input amplifier circuit in accordance with the present invention is shown. A circuit 250 represents an inverting amplifier connection scheme and includes a multiple input single ended amplifier having a differential amplifier 251, multiple input lines 252, 254, 256, and an output $e_o$ on a line 270. The positive input of amplifier 251 is grounded via a line 258. A multiplicity of input signals 260, 262, and 264 are selected as the input into amplifier 251 by a channel select circuit 266 via channel select lines 268. The channel select circuit is comprised of a plurality of input select drivers as described hereinbefore and provided on the channel or input select driver lines. Resistors RA1, RA2, RAM are connected between input signal sources $V_{IN1}$, $V_{IN2}$, $V_{INM}$ and input lines 252, 254, 256, respectively. Resistors RB1, RB2, RBM are connected between the input lines 252, 254, 256 and the output line 270. The gain of the amplifier is determined by the values of the resistors wherein the gain A for the selected signal $V_{INX}$ circuit (where X is 1, 2, M) is described by the following equation.

$$A=-(RBX/RAX)$$

Figure 4:
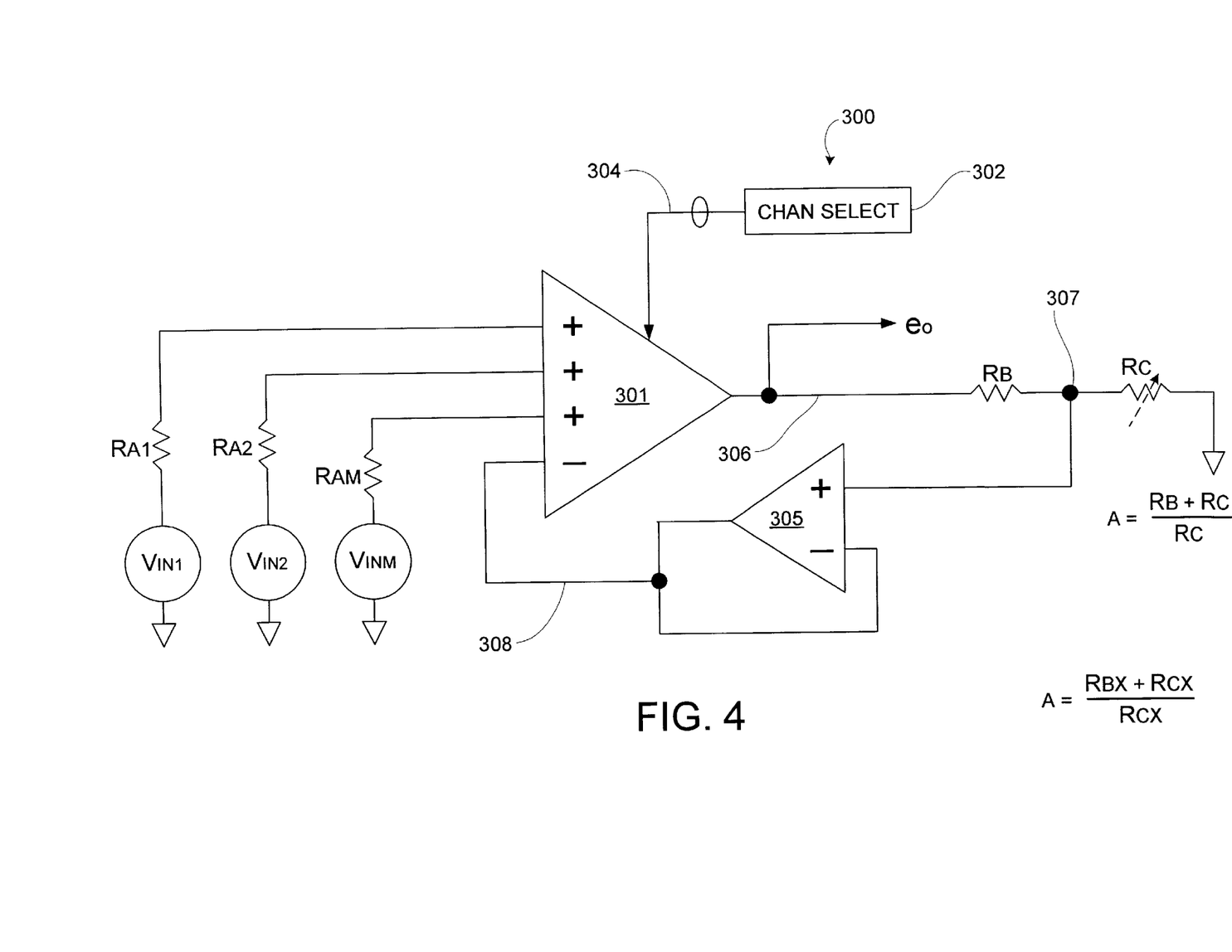
FIG. 4 is a simplified schematic drawing of an alternative application of an amplifier circuit in accordance with the present invention.

Referring now to FIG. 4, wherein an amplifier circuit 300 is provided selected inputs from multiple driving input signal sources $V_{IN1}$, $V_{IN2}$, $V_{INM}$ through resistors RA1, RA2, RAM, respectively. The output $e_o$, of amplifier 301 is provided on a line 306 to a resistor RB. The input signal sources are selected by a channel select circuit 302 via selection lines 304. A variable resistor RC is connected between RB and ground. The positive input of an operational amplifier 305 is connected to the node 307 between RB and RC. The output of amplifier 305 connected via a feed back line 308 to the minus input of amplifier 301 and the its own minus input. The gain A for the selected signal $V_{INX}$ circuit (where X is 1, 2, M) is represented by the following equation.

$$A=(RBX+RCX)/RCX$$

Circuit 300 provides a configuration for variable non-inverting gains other than unity. A separate feedback buffer may be required because the unselected pair feedback points may represent a variable load to the divider circuit RB and RC, thereby causing the feedback voltage at the selected pair transistor base to be different than the output [e$_o$X (RB+ RC)/RC]. The configuration of FIG. 4 is preferred for implementation of the present invention where there are are large number of input channels to select from.

Figure 5:
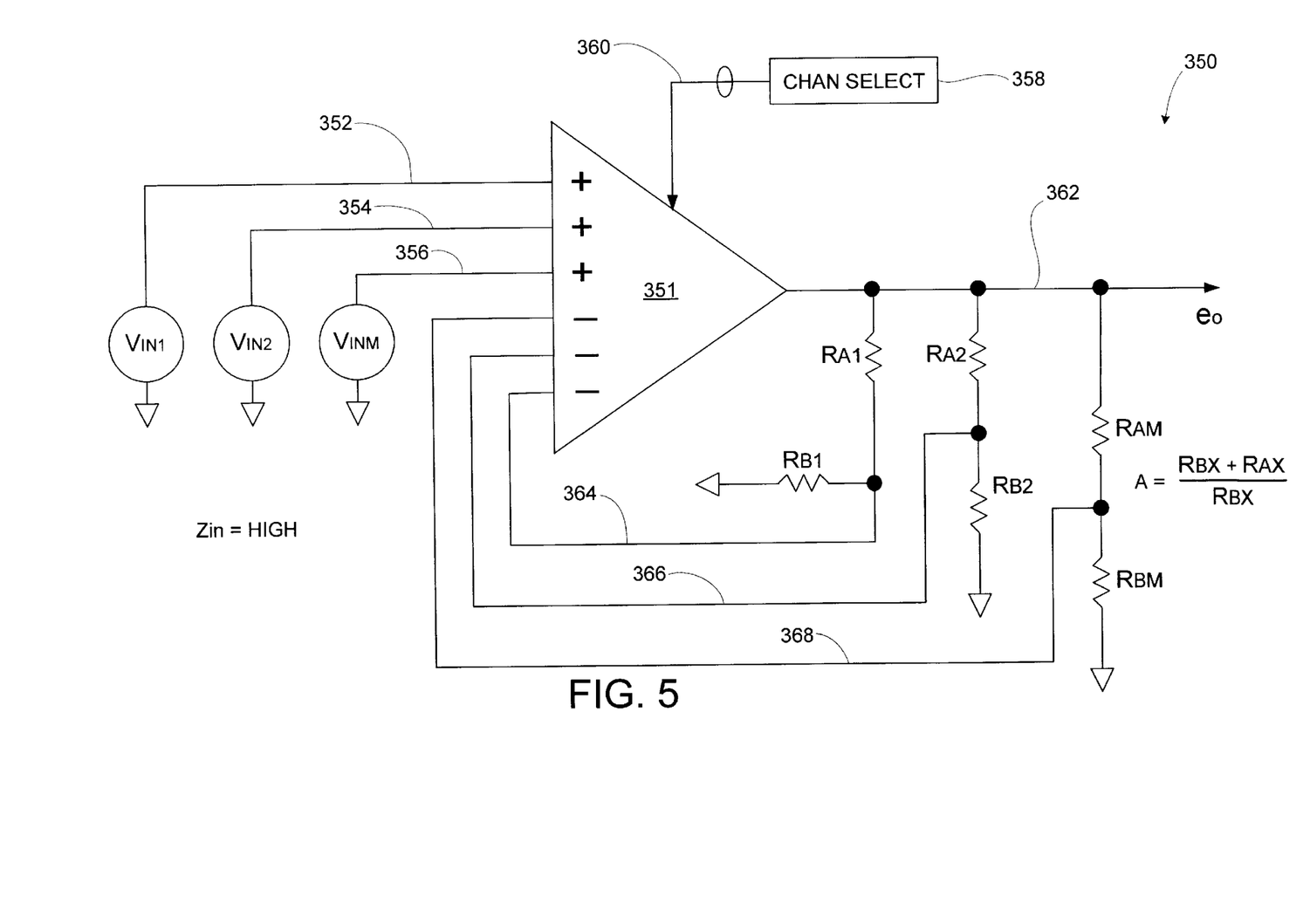
FIG. 5 is a simplified schematic drawing of an alternative application of an amplifier circuit in accordance with the present invention.

Referring now to FIG. 5, an alternative embodiment employing the amplifier circuit in accordance with the present invention includes a circuit 350 having an amplifier circuit 351 with multiple inputs. A multiplicity of input terminals are provided input signals from multiple input signal drivers V$_{IN1}$, V$_{IN2}$, V$_{INM}$ via lines 352, 354, 356. The different input signals are selected utilizing a channel select circuit 358 via a line 360. The output e$_o$ of amplifier circuit 351 is provided on a line 362. A resistor RA1 is connected between output line 362 and a feedback line 364. A resistor RB1 is connected between feedback line 364 and ground. A resistor RA2 is connected between input line 362 and a feedback line 366. A resistor RB2 is connected between feedback line 366 and ground. A resistor RAM is connected between output line 362 and a feedback line 368 and a resistor RBM is connected between feedback line 368 and ground. Both the positive and negative inputs are selected simultaneously using the channel select signals as described hereinbefore. Selecting the different feedback loops can provide different throughput gains for the circuit wherein the gain A for the selected signal V$_{INX}$ circuit (where X is 1, 2, M) is described by the following equation.

$$A = 1 + (RAX/RBX)$$

It can be seen that the selection of V$_{IN1}$, and V$_{IN2}$ with the corresponding utilization of feedback lines 364 and 366 are representative of a simplified schematic diagram of the V$_{IN1}$' and V$_{IN2}$' circuit paths illustrated in FIG. 1B.

Figure 6:
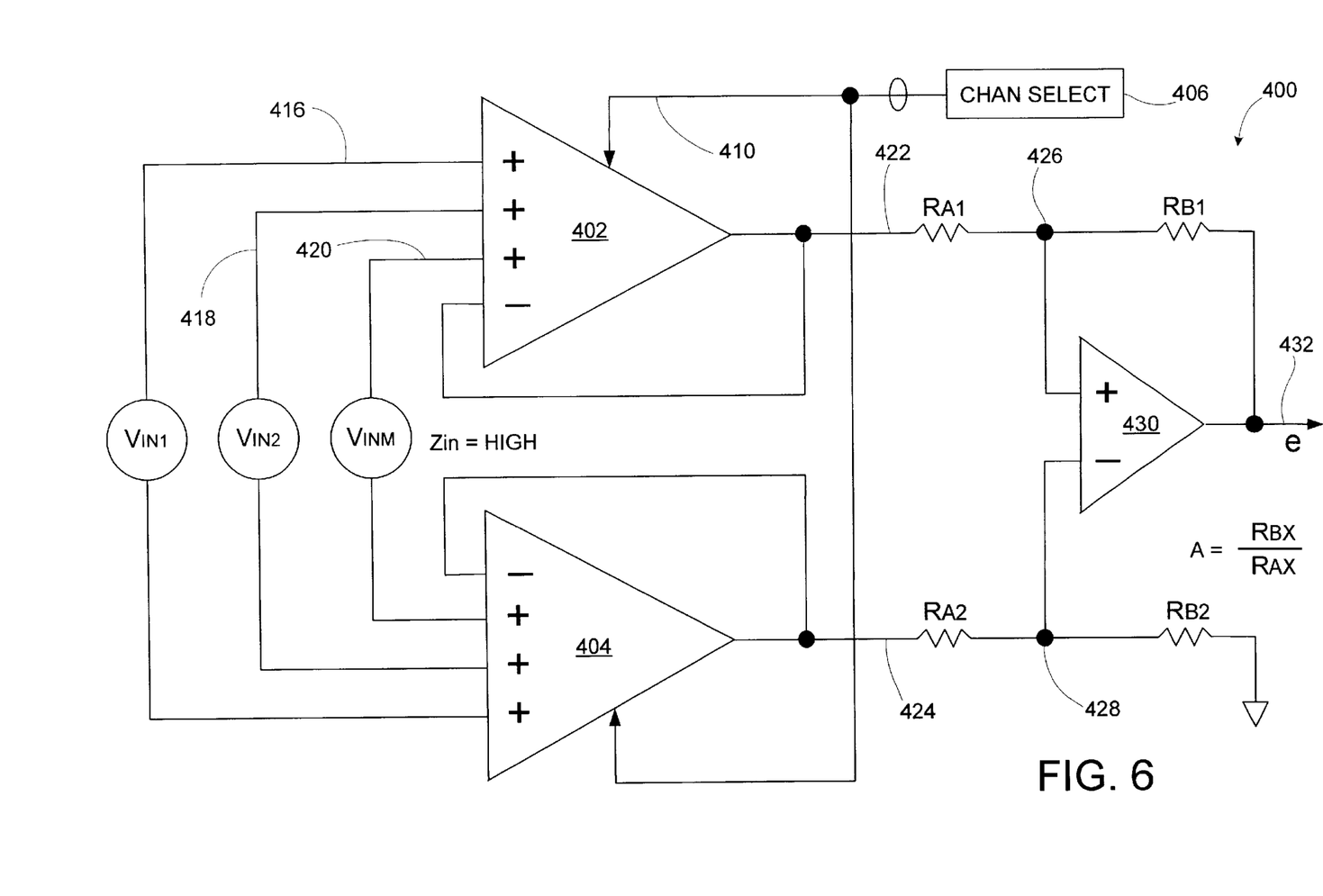
FIG. 6 is a simplified schematic drawing of an alternative application of an amplifier circuit in accordance with the present invention.

Referring now to FIG. 6 wherein an alternative circuit 400 is provided which utilizes the amplifier circuit of the present invention and includes two amplification circuits 402, 404 having multiple inputs, the selection of which is controlled by a channel selection circuit 406 via line 410. Circuit 404 is a complementary amplification circuit to circuit 402. That is, circuit 404 receives the inverse of the input signal provide to circuit 402.

Input signals are selected from a plurality of input signal drivers V$_{IN1}$, V$_{IN2}$, V$_{INM}$ which provide the signals on line 416, 418, 420 respectively. The output of amplifier 402 is provided on a line 422 which is fed back to the minus input of amplifier 402. The output of amplifier 404 is provided on a line 424 and is fed back to its minus input. A pair of identical value (or near identical) resistors RA1, RA2 are connected between output lines 422, 424 and a pair of nodes 426, 428, respectively. An amplifier 430 has its positive input connected to node 428 and its negative input connected to node 426. The output e$_o$ of amplifier 430 is provided on a line 432. A resistor RB1 is connected between node 426 and output line 432. A resistor RB2 (with the same or near identical value as RB1) is connected between node 428 and ground. The gain A for the selected signal V$_{INX}$ circuit (where X is 1, 2, M) is described by the following equation.

$$A = (RBX/RAX)$$

Circuit 400 may utilize a pair of amplifier circuits such as that shown in FIG. 3 hereinbefore, followed by a traditional subtracting or difference amplifier 430. Circuit 400 is commonly referred to as a three amplifier instrumentation configuration. In this configuration, the prior art typically utilized single input operational amplifiers. In the present configuration, a multiple input operational amplifier with input channel selection can be utilized. It can be seen that circuit 400 minimizes the number of precision resistors necessary since only four are required for a typical group of eight to sixteen input channels. It is also to be noted that the advantages of a high input impedance with power off and a low input bias current described hereinbefore for the single ended configurations also applies for this circuit. Also, circuit 400 shows how the present invention is adapted to provide a multiple input instrumentation amplifier function. Current inputs are low accept when an input channel is sampled by having the feedback point more positive than the respective inputs when not being sampled.

Figure 7:
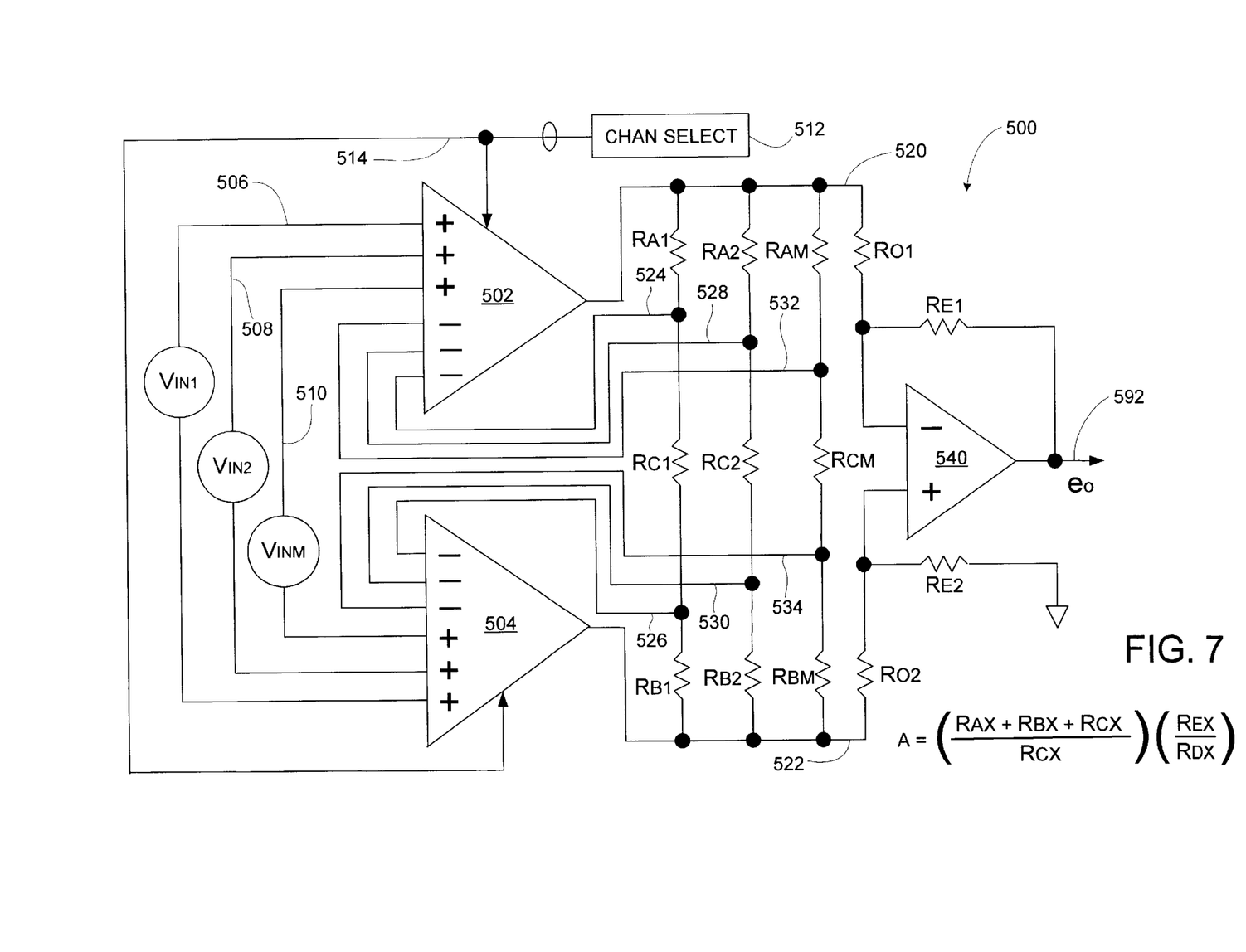
FIG. 7 is a simplified schematic drawing of an alternative application of an amplifier circuit in accordance with the present invention.

Referring now to FIG. 7, wherein an alternative circuit utilizing an amplifier circuit in accordance with the present invention includes a pair of amplifiers 502, 504 similar to those described hereinbefore in FIG. 1 and FIG. 2. Circuit 504 is a complementary amplification circuit to circuit 502. That is, circuit 504 receives the inverse of the input signal provide to circuit 502. Amplifiers have a multiplicity of input signals provided from input signal drivers V$_{IN1}$, V$_{IN2}$, V$_{INM}$ on lines 506, 508, 510 respectively. The input signals are selected by a channel select circuit 512 which provides channel select signals on a line 514. The output of amplifier 502 is provided on a line 520 and the output of amplifier 504 is provided on a line 522. When input signal V$_{IN1}$ is selected, the output signals of amplifiers 502, 504 are fed back through resistors RA1 RB1, RC1 via lines 524, 526 respectively. When input signal V$_{IN2}$ is selected, the output signals of amplifiers 502, 504 are fed back through resistors RA2, RB2, RC2 via lines 528, 530 respectively. When input signal V$_{INM}$ is selected, the output signals of amplifiers 502, 504 are fed back through resistors RAM, RBM, RCM via lines 532, 534 respectively. A resistor RD1 is connected between line 520 and the minus input of an amplifier 540. A resistor RD2 (with the same or near identical value of RD1) is connected between line 522 and the positive input of amplifier 540. Amplifier provides an output e$_o$ on a line 542. A resistor RE1 is connected between the minus input of amplifier 540 and output line 542. A resistor RE2 (with the same or near identical value of RE1) is connected between the positive input of amplifier 540 and ground. The gain A for the selected signal V$_{INX}$ circuit (where X is 1, 2, M) is described by the following equation.

$$A = \frac{RAX + RBX + RCX}{RCX} \times \frac{REX}{RDX}$$

FIG. 7 represents a three amplifier instrumentation configuration similar to that shown in FIG. 6, but with a variable gain achievable for each input channel selection by the use of the RAX, RBX and RCX resistors.

It is to be understood that the circuit approaches described above can be implemented in a number of semiconductors technologies including other types of transistors, such as field effect transistors (i.e. JFET, IGFET, MOSFET, CMOS, etc.) instead of the bipolar transistors shown in FIGS. 1A, 1B. In such a case, the gate, drain and source of the field effect transistors would correlate with the base, collector and emitter of the bipolars. It is to be noted however, that bipolar transistor implementation provides superior immunity to abnormal input voltages of either polarity. The present circuit lends itself well to monolithic integration which can lead to very low cost as well as very small embodiment. Very high speed is obtainable because the circuits 100, 100' utilize current steering rather than current gating. It can also be seen that existing discrete circuitry technology can be applied. It is also understood by those skilled in the art that isolated or floating inputs can be accommodated by the present configuration. The high speed possible utilizing current steering is due to the fact that very small voltage level changes can effectuate the input selection. It is also to be noted that more than one input can be selected at one time. The final output on lines 114, 114' then becomes the sum of the input selected. This in an efficient way to sum inputs, particularly when they are differential in nature.

Although the invention has been shown and described with exemplary embodiments thereof, it should be understood by those skilled in the art that the foregoing and various other changes, omissions and additions may be made therein and thereto without departing from the spirit and the scope of the invention. For example, the connection of circuit components such as resistors and capacitors in circuit locations not specifically shown herein may be desirable in a particular circumstance and is still within the scope of the present invention.

What is claimed is:

1. A multiplexing amplifier circuit which receives a plurality of input signals selected by a plurality of select control signals, the multiplexing amplifier circuit comprising:

an amplifier which provides an output signal indicative of the input signal at a positive input and a negative input;

a selection circuit corresponding to each input signal having a longtail pair of first and second transistors wherein the first transistor receives the input signal and drives the negative input of the amplifier and the second transistor receives the feed back output signal and drives the positive input of the amplifier;

a pair of diodes connected to each transistor for steering the current through the transistor;

wherein each select signal biases the corresponding diodes to thereby cause its corresponding longtail transistor pair to provide the corresponding input signal to the amplifier inputs.

2. A multiplexing amplifier circuit in accordance with claim 1, wherein the amplifier is configured for unity gain.

3. A multiplexing amplifier circuit in accordance with claim 1, wherein the amplifier is configured for variable gain.

4. A multiplexing amplifier circuit in accordance with claim 1, wherein at least two of the selection circuits are configured for different throughput gains.

5. A multiplexing amplifier circuit in accordance with claim 1, further comprising an operational amplifier for buffering the feedback output signal to at least one selection circuit.

6. A multiplexing amplifier circuit in accordance with claim 1, wherein at least one of the longtail transistor pairs is comprised of bipolar transistors.

7. A multiplexing amplifier circuit in accordance with claim 1, wherein at least one of the longtail transistor pairs is comprised of field effect transistors.

8. A multiplexing amplifier circuit in accordance with claim 1, wherein at unselected input signals are at a lower voltage than the feedback signal to thereby facilitate low current drains from the unselected signal sources.

9. A multiplexing amplifier circuit in accordance with claim 1, further comprising:

a complementary amplifier corresponding to the amplifier which provides a complementary output signal indicative of the input signal across a positive input and a negative input of the complementary amplifier;

a complementary selection circuit also corresponding to each input signal having:

a complementary longtail pair of third and fourth transistors wherein the third transistor receives the inverse input signal and drives the negative input of the complementary amplifier and the fourth transistor receives the feed back complementary output signal and drives the positive input of the complementary amplifier;

a pair of complementary diodes connected to each complementary transistor for steering the current through the complementary transistor, wherein each select signal biases the corresponding complementary diodes to thereby cause its corresponding complementary longtail transistor pair to provide the corresponding input signal across the complementary amplifier inputs; and a third amplifier which provides a third output signal indicative of the difference between the output signal and the complementary output signal.

10. A multiplexing amplifier circuit in accordance with claim 9, wherein the amplifier and corresponding selection circuits, the complementary amplifier and corresponding complementary selection circuits, and the third amplifier are arranged in a three amplifier instrumentation configuration.

11. A multiplexing amplifier circuit which receives a plurality of input signals and a plurality of select control signals and is provided positive and negative supply voltages, the multiplexing amplifier circuit comprising:

an amplifier which provides an output signal indicative of the input signal across a positive input and a negative input;

a selection circuit corresponding to each input signal having:

a first transistor having a base which is provided one of the plurality of input signals, an emitter provided the negative supply voltage and a collector;

a second transistor having a base provided the output signal as feed back, an emitter provided the negative supply voltage and a collector;

a first diode having a cathode connected to the first transistor collector and an anode provided the positive supply voltage and connected to the amplifier negative input;

a second diode having a cathode connected to the first transistor collector and an anode provided the select signal;

a third diode having a cathode connected to the second transistor collector and an anode provided the positive supply voltage and connected to the amplifier positive input; and, a fourth diode having a cathode connected to the second transistor collector and an anode provided the select signal;

wherein the select signal causes the input signal to be provided across the amplifier positive and negative inputs.

12. A multiplexing amplifier circuit in accordance with claim 11, wherein the amplifier is configured for unity gain.

13. A multiplexing amplifier circuit in accordance with claim 11, wherein the amplifier is configured for variable gain.

14. A multiplexing amplifier circuit in accordance with claim 11, wherein at least two of the selection circuits are configured for different throughput gains.

15. A multiplexing amplifier circuit in accordance with claim 11, further comprising an operational amplifier for buffering the feedback output signal to at least one selection circuit.

16. A multiplexing amplifier circuit in accordance with claim 11, wherein at unselected input signals are at a lower voltage than the feedback signal to thereby facilitate low current drains from the unselected signal sources.

17. A multiplexing amplifier circuit in accordance with claim 11, further comprising:
 a complementary amplifier corresponding to the amplifier which provides a complementary output signal indicative of the input signal across a positive input and a negative input of the complementary amplifier;
 a complementary selection circuit also corresponding to each input signal having:
  a third transistor having a base which is provided the inverse of the input signal, an emitter provided the negative supply voltage and a collector;
  a fourth transistor having a base provided the complementary output signal as feed back, an emitter provided the negative supply voltage and a collector;
  a fifth diode having a cathode connected to the third transistor collector and an anode provided the positive supply voltage and connected to the complementary amplifier negative input;
  a sixth diode having a cathode connected to the third transistor collector and an anode provided the select signal;
  a seventh diode having a cathode connected to the fourth transistor collector and an anode provided the positive supply voltage and connected to the amplifier positive input; and,
  an eighth diode having a cathode connected to the fourth transistor collector and an anode provided the select signal,
 wherein the select signal causes the inverse input signal to be provided across the complementary amplifier positive and negative inputs; and,
 a third amplifier which is provided the output signal and the complementary output signal at its inputs and the third amplifier provides a third output signal indicative of the input signal.

18. A multiplexing amplifier circuit in accordance with claim 17, wherein the amplifier and corresponding selection circuits, the complementary amplifier and corresponding complementary selection circuits, and the third amplifier are arranged in a three amplifier instrumentation configuration.

19. A multiplexing amplifier circuit which receives a plurality of input signals selected by a plurality of select control signals, the multiplexing amplifier circuit comprising:
 an amplifier means for providing an output signal indicative of the input signal across a positive input and a negative input;
 a selection circuit means corresponding to each input signal having
  longtail transistor means for receiving the input signal to drive the negative input of the amplifier means and receiving the feed back output signal to drive the positive input of the amplifier means;
  diode means for steering current when selected through the longtail transistor means to thereby provide the corresponding input signal of a plurality of input signals across the amplifier means inputs.

20. A multiplexing amplifier circuit in accordance with claim 19, wherein the amplifier means is configured for unity gain.

21. A multiplexing amplifier circuit in accordance with claim 19, wherein the amplifier means is configured for variable gain.

22. A multiplexing amplifier circuit in accordance with claim 19, wherein at least two of the selection circuit means are configured for different throughput gains.

23. A multiplexing amplifier circuit in accordance with claim 19, further comprising an operational amplifier means for buffering the feedback output signal to at least one selection circuit.

24. A multiplexing amplifier circuit in accordance with claim 19, wherein at unselected input signals are at a lower voltage than the feedback signal to thereby facilitate low current drains from the unselected signal sources.

25. A multiplexing amplifier circuit in accordance with claim 19, further comprising:
 a complementary amplifier means corresponding to the amplifier means which provides a complementary output signal indicative of the input signal across a positive input and a negative input of the complementary amplifier means;
 a complementary selection circuit means also corresponding to each input signal having:
  complementary longtail transistor means for receiving the inverse input signal and driving the negative input of the complementary amplifier means and for receiving the feed back
  complementary output signal and driving the positive input of the complementary amplifier means;
 complementary diode means for steering current through the complementary longtail transistor means when selected to thereby cause its corresponding complementary longtail transistor means to provide the corresponding input signal across the complementary amplifier means inputs; and
 a third amplifier means for providing a third output signal indicative of the output signal and the complementary output signal.

26. A multiplexing amplifier circuit in accordance with claim 5, wherein the gain of the amplifier circuit is determined by a high resistance voltage divider.

27. A multiplexing amplifier circuit in accordance with claim 15, wherein the gain of the amplifier circuit is determined by a high resistance voltage divider.

28. A multiplexing amplifier circuit in accordance with claim 23, wherein the gain of the amplifier circuit is determined by a high resistance voltage divider.

* * * * *